(12) United States Patent
Nguyen

(10) Patent No.: US 9,024,701 B1
(45) Date of Patent: May 5, 2015

(54) METHOD AND APPARATUS FOR CONTROLLING A LINE SIDE IMPEDANCE IN A NETWORK DEVICE

(75) Inventor: Thanh V. Nguyen, Santa Ana, CA (US)

(73) Assignee: Marvell International Ltd., Hamilton (BM)

( * ) Notice: Subject to any disclaimer, the term of this patent is extended or adjusted under 35 U.S.C. 154(b) by 331 days.

(21) Appl. No.: 13/488,786

(22) Filed: Jun. 5, 2012

Related U.S. Application Data

(60) Provisional application No. 61/494,601, filed on Jun. 8, 2011.

(51) Int. Cl.
*H01F 27/42* (2006.01)
*H03H 7/09* (2006.01)
*H03H 7/12* (2006.01)
*H03H 7/38* (2006.01)

(52) U.S. Cl.
CPC . *H03H 7/09* (2013.01); *H03H 7/12* (2013.01); *H03H 7/38* (2013.01)

(58) Field of Classification Search
USPC .................................................. 333/33, 32
See application file for complete search history.

(56) References Cited

U.S. PATENT DOCUMENTS

2002/0149439 A1* 10/2002 Toncich ................. 333/24.2
2006/0215566 A1*  9/2006 Walsh ................... 370/241

* cited by examiner

*Primary Examiner* — Stephen E Jones
*Assistant Examiner* — Scott S Outten

(57) ABSTRACT

In one embodiment, an apparatus includes a line side of a network device. The line side is configured to connect to a device external to the network device. The apparatus also includes a physical side of the network device. The physical side is configured to communicate with an external entity. An isolation device is configured to isolate the physical side from the line side. An inductor is coupled between the line side and the physical side. The inductor has a value configured to control a matching of an impedance of the line side with an impedance of the physical side as seen through the isolation device.

20 Claims, 5 Drawing Sheets

METHOD AND APPARATUS FOR CONTROLLING A LINE SIDE IMPEDANCE IN A NETWORK DEVICE

CROSS REFERENCE TO RELATED APPLICATIONS

The present disclosure claims priority to U.S. Provisional App. No. 61/494,601, filed on Jun. 8, 2011, which is incorporated herein by reference in its entirety for all purposes.

BACKGROUND

The background description provided herein is for the purpose of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

A network device is a device that processes data in a network. For example, common network devices include gateways, routers, bridges, switches, hubs, repeaters, and the like. In some applications, a communication cable may be coupled to a network device to permit the network device to communicate, via the communication cable, over the network. An interface between a communication cable and a network device is typically needed to couple the network device to the cable. However, the interface may be a source of an impedance mismatch between the network device and the combined impedance of the interface and communication cable. Impedance mismatches may lead to return loss, which corresponds to an unwanted loss of signal power at transitions between the network device, the interface, and the communication cable.

FIG. 1 shows a graph 10 showing an impedance of a network device in relation to frequency. The frequency shown in graph 10 corresponds to a frequency of operation of the network device. The impedance is shown on the y axis and the frequency is shown on the x axis of graph 10. As shown, the impedance varies with respect to frequency. At higher frequencies, the impedance variation increases. The impedance of the network device may be acceptable between 1 MHz and 125 MHz because the return loss due to impedance mismatch is acceptable. However, in a network device that communicates at 10 gigabits, the bandwidth may extend to 500 MHz. In this case, the impedance variance causes an impedance mismatch that leads to a large return loss across the wide frequency band.

SUMMARY

In one embodiment, an apparatus includes a line side of a network device. The line side is configured to connect to a device external to the network device. The apparatus also includes a physical side of the network device. The physical side is configured to communicate with an external entity. An isolation device is configured to isolate the physical side from the line side. An inductor is coupled between the line side and the physical side. The inductor has a value configured to control a matching of an impedance of the line side with an impedance of the physical side as seen through the isolation device.

In one embodiment, a plurality of channels are provided between the line side and the physical side, wherein the impedance on the physical side of each channel is substantially matched to the impedance on the line side of each channel.

In one embodiment, the impedance of the line side includes a combined impedance of a connector of the network device, a connector of the device external to the network device, and the connection device.

In one embodiment, the isolation device includes a transformer.

In one embodiment, the connection device includes a cable.

In one embodiment, a method includes upon receiving a coupling of a cable to a connector of a network device configured to connect to the cable, isolating, by a transformer, a transmitter or receiver of the network device from the cable, wherein the transmitter or receiver sends or receives communications to and from the cable; and coupling a set of signal through a set of inductors between the transmitter or receiver and the cable, each inductor having a value configured to control a matching of an output impedance of the transformer with a combined impedance of the connector of the network device and the cable.

The following detailed description and accompanying drawings provide a more detailed understanding of the nature and advantages of particular embodiments.

DETAILED DESCRIPTION

Described herein are techniques for an impedance control system. In the following description, for purposes of explanation, numerous examples and specific details are set forth in order to provide a thorough understanding of particular embodiments. Particular embodiments as defined by the claims may include some or all of the features in these examples alone or in combination with other features described below, and may further include modifications and equivalents of the features and concepts described herein.

Figure 2:
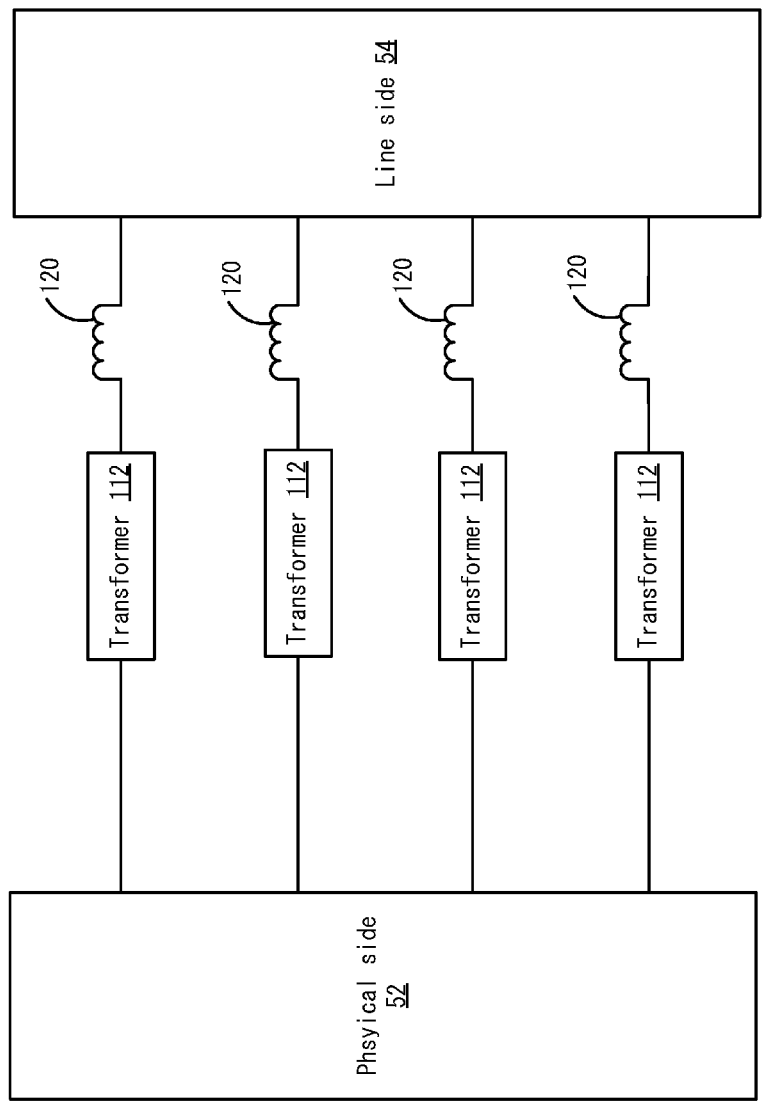
FIG. 2 depicts a simplified system for impedance matching according to one embodiment.

FIG. 2 depicts a simplified system 50 for impedance matching according to one embodiment. As shown, a physical side 52 and a line side 54 are shown. Physical side 52 and line side 54 may be part of a network device. Physical side 52 includes components that send and receive communications via line side 54. Line side 54 may include an interface and be connected to a connector of a cable. One or more transformers 112 couple physical side 52 to line side 54. Transformers 112 isolate physical side 52 from line side 54. Also, transformers 112 are used to "step up" or "step down" alternating current (AC) voltage between line side 54 and physical side 52. Although transformers 112 are described, other devices to isolate physical side 52 from line side 54 may be used.

Particular embodiments use inductors 120 to provide impedance matching between line side 54 and physical side 52. Inductors 120, as will be described in more detail below, improve the impedance matching over a wide bandwidth. For example, values of inductors 120 are selected to control the matching of impedances between line side 54 and physical side 52. Thus, network devices operating at a wide range of frequency, such as 1 gigabit, may not suffer from return loss over a large bandwidth.

Figure 3:
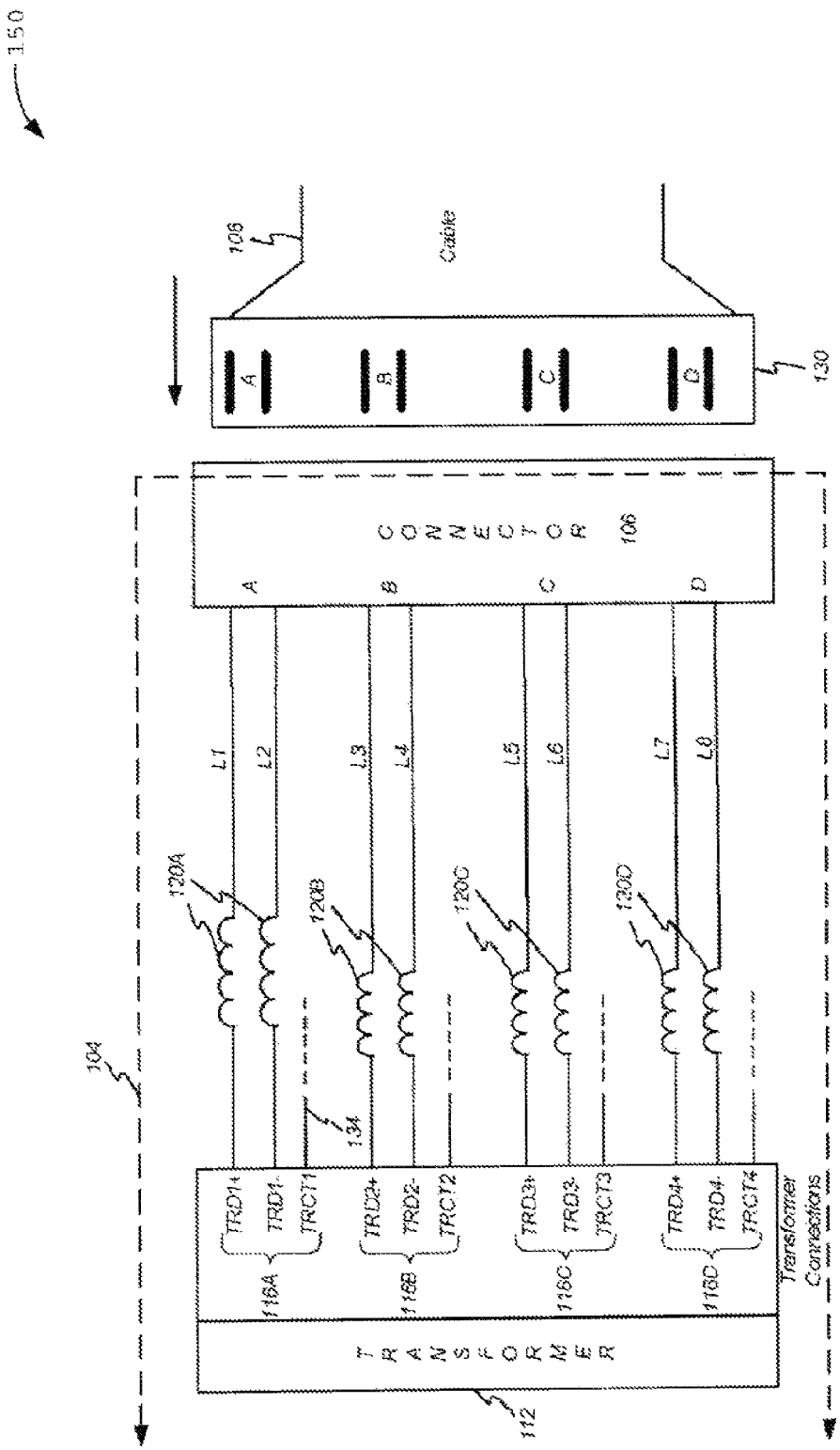
FIG. 3 depicts a more detailed example of a system according to one embodiment.

FIG. 3 depicts a more detailed example of system 150 according to one embodiment. A network device 104 connects to a communication cable 108. Although this configuration is shown, a person of skill in the art will appreciate other configurations.

Network device 104 may be any type of computing device that communicates with cable 108. For example, network device 104 includes a transmitter and receiver. In one example, network device 104 includes an electrical board having components mounted thereon.

Cable 108 may be a physical transmission medium. Cable 108 may include a category (CAT) 5, CAT 5E, CAT 6, or CAT 6A cable. Cable 108 includes a cable connector 130. Cable connector 130 is configured to couple to a connector 106 of network device 104. Connector 106 may be an interface that allows a connection to be made between network device 104 and cable 108. Although the connection shown is physical, wireless connections may be used.

Electrical transfer of signals between network device 104 and cable 108 may occur via connector 106 and cable connector 130. Cable 108 may include four channels: channel A, channel B, channel C, and channel D. Each channel may be a transmission medium, such as one or more wires. Connector 106 includes a corresponding channel A, channel B, channel C, and channel D. Also, cable connector 130 and network device connector 106 may be any type of connector, such as an RJ45-type connector.

Connector 106 couples to a set of lines L1-L8. Although 8 lines are shown, any other number of lines will be appreciated. Lines may be a set of wires. In one embodiment, each channel includes two lines, but channels may include a different number of lines. For example, channel A includes lines L1 and L2; channel B includes lines L3 and L4; channel C includes lines L5 and L6; and channel D includes lines L7 and L8. In one embodiment, the line pairs are twisted pair conductors.

A transformer 112 is provided to isolate a receiver and/or transmitter of network device 104 from cable 108. Although one transformer 112 is shown, multiple transformers 112 may be provided. For example, a transformer 112 for each channel may be used.

Transformer 112 includes tap connectors 116A-116D. Channel A including lines L1 and L2 connects to transformer tap connector 116A, which includes a connection TRD1+ (positive connection) and TRD1− (negative connection) of transformer 112. A center tap connector 134 may also be provided and be connected to one or more circuits (not shown) to obtain a desired circuit performance. Additionally, transformer 112 may have additional electrical connections that provide incoming signals to a receiver and outgoing signals to a transmitter to transformer 112.

Inductors 120 are used to maintain consistent impedance across a wide bandwidth of frequency, such as of a frequency between 1 MHz to 500 MHz. For example, an impedance looking into transformer 112 (e.g., output impedance) may be kept at a consistent impedance of substantially 50 ohms. This matches an output impedance of transformer 112 to a combined impedance of connector 106, cable connector 130, and cable 108, and minimizes return loss.

Inductors 120 may be included for each channel, such as for each line. For example, inductors 120A are included on lines L1 and L2; inductors 1206 are included on lines L3 and L4; inductors 120C are included on lies L5 and L6; and inductors 1206 are included on lines L7 and L8. The impedance of inductors 120 for different lines may be different or the same depending on the configuration of transformer 112, connector 106, circuits attached to center tap 134, or cable 108. In one embodiment, the inductor values for inductors 120A and 120D are between 2 and 3 nanohenrys and the inductor values for inductors 120B and 120C are between 3 and 4 nanohenrys. Other inductor values may also be appreciated. Additionally, all inductors 120 may be the same value. Or, the inductor values associated with a channel may also be different. For example, an inductor value for line L1 may be different from an inductor value for line L2. Inductors 120 may include discrete elements attached to network device 104, or be built into a board that is implementing network device 104, connector 106, cable connector 130, or transformer 112.

Figure 1:
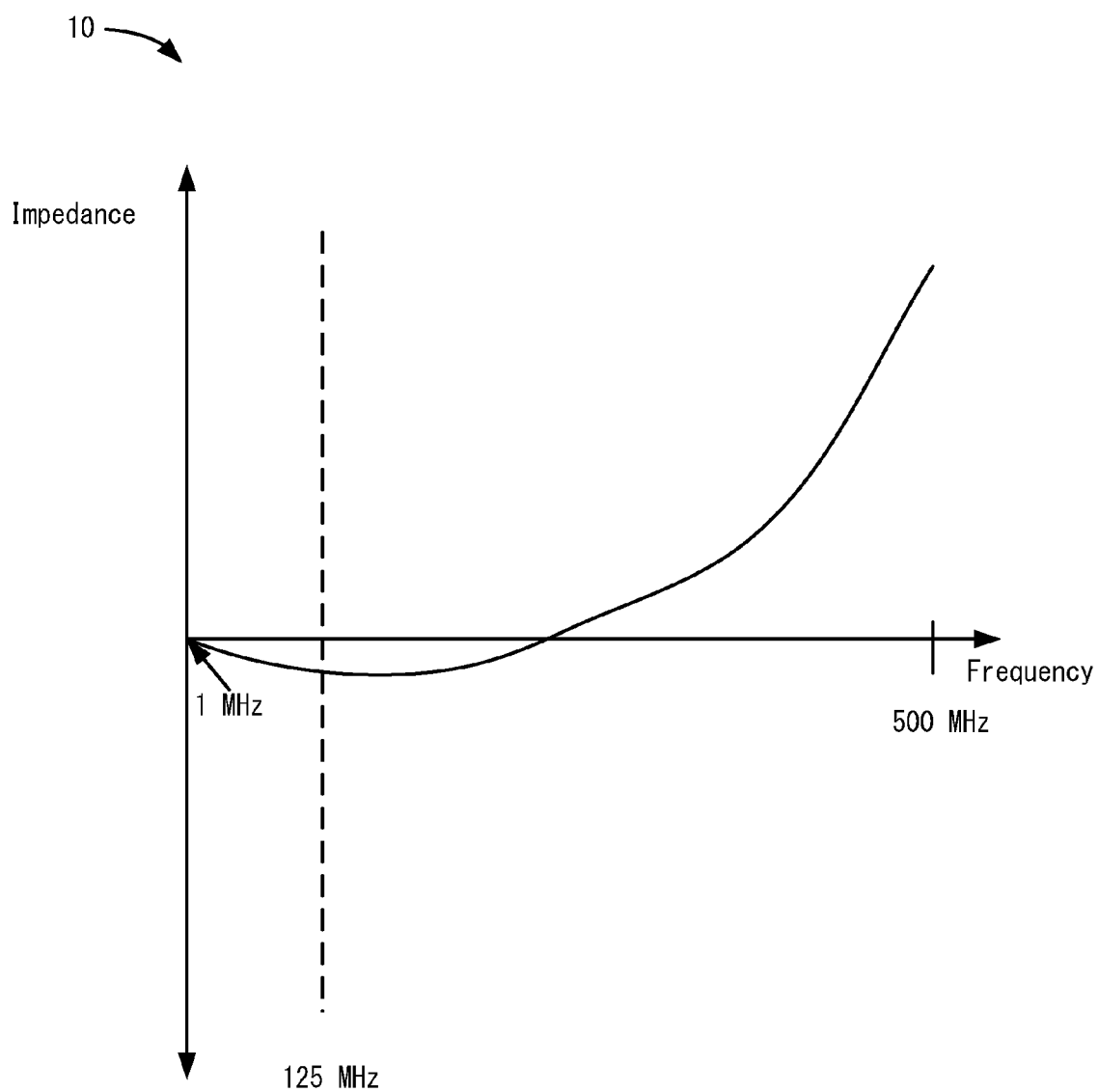
FIG. 1 shows a graph showing an impedance of a network device in relation to frequency.
Figure 4:
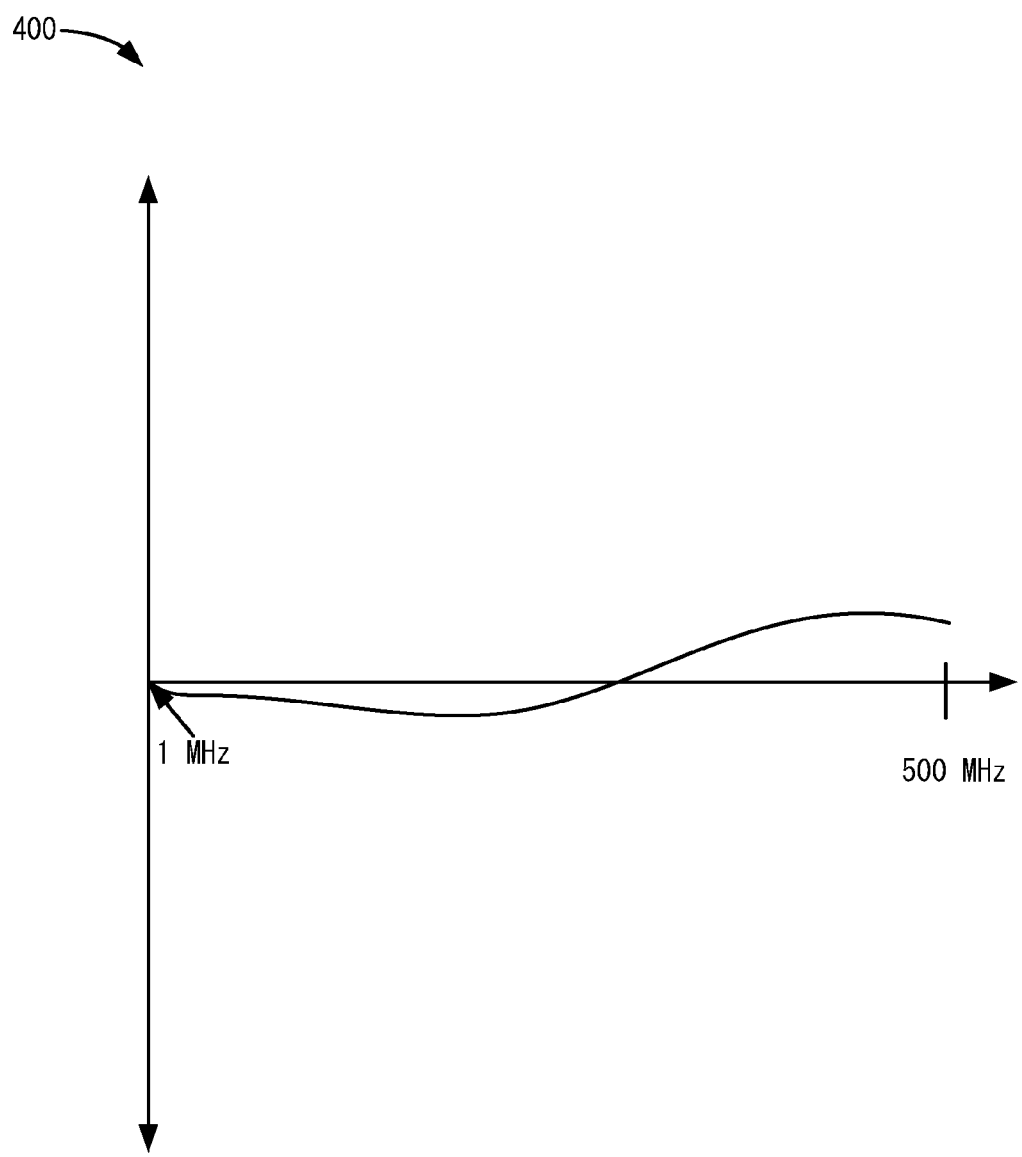
FIG. 4 depicts a graph of the output impedance of a transformer versus frequency according to one embodiment.

Inductors 120 help match the output impedance from transformer 112 and a combined impedance of connector 106, cable connector 130, and cable 108. In one embodiment, inductor values are selected to minimize return loss. FIG. 4 depicts a graph 400 of the output impedance of transformer 112 versus frequency according to one embodiment. As shown, the impedance variance between 1 MHz and 500 MHz has been reduced when compared to the impedance variance as shown in FIG. 1. For example, the addition of inductors 112 draw the impedance up if the impedance is negative and also draw the impedance down if the impedance is positive. This reduces the variance of the impedance over the desired bandwidth.

Figure 5:
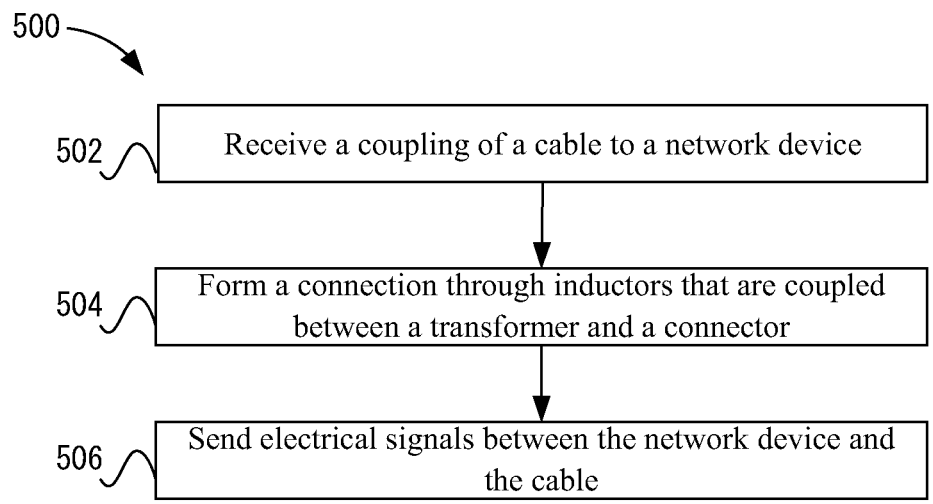
FIG. 5 depicts a simplified flowchart of a method for matching impedance according to one embodiment.

FIG. 5 depicts a simplified flowchart 500 of a method for matching impedance according to one embodiment. At 502, a coupling of cable 108 to network device 104 is received. For example, a cable connector 130 of cable 108 is coupled to connector 106. At 504, a connection is formed through inductors 120 that are coupled between transformer 112 and connector 106. At 506, electrical signals are sent between network device 104 and cable 108. Inductors 120 maintain the output impedance of transformer 112 across a wide range of frequency.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. An apparatus comprising:
   a line side of a network device, the line side configured to connect to a device external to the network device, wherein the line side comprises a connector of the network device configured to connect to the device external to the network device, and wherein the device external to the network device includes a cable;
   a physical side of the network device, the physical side configured to communicate with an external entity;
   an isolation device configured to isolate the physical side from the line side, wherein the isolation device includes a transformer configured to isolate a transmitter or receiver of the network device from the cable, and wherein the transmitter or receiver sends or receives communications to and from the cable; and a set of inductors coupled between the transmitter or receiver and the cable, wherein each inductor of the set of inductors has an inductance value configured to control a matching of an output impedance of the transformer with a combined impedance of the connector of the network device and the cable.

2. The apparatus of claim 1, further comprising a plurality of channels between the line side and the physical side, wherein the impedance on the physical side of each channel is substantially matched to the impedance on the line side of each channel.

3. The apparatus of claim 2, wherein:
each channel in the plurality of channels includes a set of lines, and
each line in the set of lines includes an inductor of the set of inductors.

4. The apparatus of claim 3, wherein each of the inductors of the set of inductors has a same inductance value.

5. The apparatus of claim 3, wherein a portion of the inductors for the set of lines include different inductance values.

6. The apparatus of claim 1, wherein:
the cable comprises a plurality of channels, and
the network device comprises a plurality of channels, wherein the set of inductors is situated on the plurality of channels of the network device.

7. The apparatus of claim 6, wherein:
each channel in the plurality of channels includes a set of lines, and
each line in the set of lines includes art inductor of the set of inductors.

8. The apparatus of claim 7, wherein inductors for each line include a same inductance value.

9. The apparatus of claim 7, wherein a portion of the inductors for the set of lines include different inductance values.

10. The apparatus of claim 1, wherein the impedance of the line side comprises a combined impedance of the connector of the network device, a connector of the device external to the network device, and the cable.

11. The apparatus of claim 1, wherein:
the cable comprises a cable connector, and
the output impedance of the transformer is matched with the combined impedance of the connector of the network device, the cable connector, and the cable.

12. The apparatus of claim 1, wherein the set of inductors are one or more matching circuits for matching the output impedance of the transformer with the combined impedance of the connector of the network device and the cable, wherein the one or more matching circuits do not include a resistor, and wherein the one or more matching circuits do not include a capacitor.

13. The apparatus of claim 1,
wherein the set of inductors are directly connected to the transformer at first points of connection with no elements being connected between the set of inductors and the transformer, and
wherein the set of inductors are directly connected to the connector at second points of connection with no elements being connected between the set of inductors and the connector.

14. The apparatus of claim 1, wherein the set of inductors includes multiple inductors, and wherein each inductor of the multiple inductors is directly connected to the transformer.

15. A method comprising:
upon receiving a coupling of a cable to a connector of a network device configured to connect to the cable, isolating, by a transformer, a transmitter or receiver of the network device from the cable, wherein the transmitter or receiver sends or receives communications to and from the cable; and
coupling a set of signals through a set of inductors between the transmitter or receiver and the cable, each inductor having a value configured to control a matching of an output impedance of the transformer with a combined impedance of the connector of the network device and the cable.

16. The method of claim 15, wherein:
the cable comprises a plurality of channels, and
the network device comprises a plurality of channels, wherein the set of inductors is situated on the plurality of channels of the network device.

17. The method of claim 16, wherein:
each channel in the plurality of channels includes a set of lines, and
each line in the set of lines includes an inductor of the set of inductors.

18. The method of claim 17, wherein inductors for each line include a same inductance value.

19. The method of claim 17, wherein a portion of the inductors for the set of lines include different inductance values.

20. The method of claim 15, wherein:
the cable comprises a cable connector, and
the output impedance of the transformer is matched with the combined impedance of the connector of the network device, the cable connector, and the cable.

* * * * *